United States Patent [19]

DeBrosse et al.

[11] Patent Number: 5,559,739
[45] Date of Patent: Sep. 24, 1996

[54] DYNAMIC RANDOM ACCESS MEMORY WITH A SIMPLE TEST ARRANGEMENT

[75] Inventors: John K. DeBrosse, Burlington, Vt.; Toshiaki Kirihata, Wappingers Falls, N.Y.; Hing Wong, Norwalk, Conn.

[73] Assignee: International Business Machines Corporation, Armonk, N.Y.

[21] Appl. No.: 535,702

[22] Filed: Sep. 28, 1995

[51] Int. Cl.$^6$ .............................. G11C 7/00; G11C 29/00
[52] U.S. Cl. .................. 365/189.01; 365/201; 365/203; 371/21.3
[58] Field of Search .................. 365/189.01, 189.02, 365/201, 202, 203, 210; 371/21.3

[56] References Cited

U.S. PATENT DOCUMENTS

| | | | |
|---|---|---|---|
| 4,839,865 | 6/1989 | Sato et al. | 365/201 |
| 5,153,853 | 10/1992 | Eby et al. | 365/185 |
| 5,157,629 | 10/1992 | Sato et al. | 365/201 |
| 5,187,685 | 2/1993 | Sato et al. | 365/189.09 |
| 5,265,056 | 11/1993 | Butler et al. | 365/201 |
| 5,305,266 | 4/1994 | Roundtree | 365/201 |
| 5,515,326 | 5/1996 | Hirose et al. | 365/189.01 |

FOREIGN PATENT DOCUMENTS

| | | |
|---|---|---|
| 56-148792 | 11/1981 | Japan . |
| 3-154289 | 11/1989 | Japan . |

OTHER PUBLICATIONS

K. S. Gray, et al, "Sense Amplifier Signal Margin Circuit" IBM Technical Disclosure Bulletin, V. 22, No. 1, pp. 56–57, Jun. 1979.

D. G. Morency, et al, "Bit Line Offset Circuit" IBM Technical Disclosure Bulletin, V. 27, No. 7B, pp. 4126–4127, Dec. 1984.

"Signal Margin Test for 4–D, 4–D with Poly Load or 6–D Random–Access Memories" IBM Technical Diclosure Bulletin, V. 28, No. 11, pp. 4792–4793, Apr. 1986.

Primary Examiner—David C. Nelms
Assistant Examiner—Trong Phan
Attorney, Agent, or Firm—Charles W. Peterson, Jr.

[57] ABSTRACT

A Dynamic Random Access Memory (DRAM) including an array of memory cells arranged in rows and columns, a word line in each row responsive to a row address and, a pair of complementary bit lines in each column. The DRAM also includes a sense amp in each column connected between a sense enable and the pair of complementary bit lines. The sense amp is a pair of cross coupled NFETs, with the sources of the NFETs connected to the sense amp enable. A bit line pre-charge is connected to each pair of complementary bit lines. The bit line pre-charge is connected between the complementary bit line pair and a reference voltage. A test control circuit selectively holds the sense amp disabled and the bit line pairs in a pre-charge state in response to a test control signal. An active sense amp load connected between the sense amp and a load enable latches data in the sense amp. The active sense amp load is a pair of cross coupled PFETs connected to the sense amp with the sources of the PFETs connected to the load enable. Optionally, each column may include a plurality of bit line pairs, each pair connected to a mux input. In this embodiment, the sense amp is connected between the mux's output and the sense amp enable. Because the control circuit uses the equalization voltage to disable the sense amp, cell signal margin may be tested in a new way. Instead of varying the sense amp reference voltage, the voltage stored in the cells is varied. So, cell signal margin is tested by varying cell signal $V_S$. $V_S$ may be selected to determine both a high and a low signal margin.

16 Claims, 7 Drawing Sheets

DYNAMIC RANDOM ACCESS MEMORY WITH A SIMPLE TEST ARRANGEMENT

RELATED APPLICATION

This application is related to application Ser. No. 08/535,446, filed on Sep. 23, 1995, to J. K. Debrosse, et al., entitled "DRAM SIGNAL MARGIN TEST METHOD" and to application Ser. No. 08/535,706, filed on Sep. 28, 1995 to Kaytoh, et al., entitled "A DATA SENSE CIRCUIT FOR DYNAMIC RANDOM ACCESS MEMORIES", both assigned to the Assignee of the present Application, filed coincident herewith and incorporated herein by reference.

FIELD OF THE INVENTION

The present invention relates generally to semiconductor memories and more particularly to testing semiconductor memory cells.

BACKGROUND OF THE INVENTION

Memory cell defects and memory array defects have many sources and, as a result, many signatures. While single, isolated cell failures may be scattered throughout the array, very often, multiple cells in the same vicinity fail. When multi-cell failures occur, these failures may be characterized as a word line failure, (i.e. failing cells with the same word line address), a bit (or column) line failure (i.e. failing cells with the same bit address), or both. The sources of these multi-cell failures vary. Consequently, memory arrays are tested extensively to identify defective cells.

FIG. 1 is a schematic representation of a prior art wide Input/Output (I/O) 16 Mb DRAM chip. The chip 100 is organized with two Redundant Bit Lines (RBL) 102 and 104 providing two spare columns in each subarray 106. Each subarray 106 includes $2^n$ Bit Line (BL) pairs 108 (where n is typically between 5 and 8) and one or more redundant bit line pairs (2 in this example). As used hereinafter, reference to a bit line refers to a complementary pair of lines. Each of the subarrays 106 is part of a subarray block 110. All of the subarray blocks 110, collectively, form the entire RAM array. So, for example, a 16Mb RAM has 16 blocks 110 of 1Mb each. Block size, subarray size and the number of subarrays 106 per block 110 are interdependent and, selected based on performance and design objectives.

Multiple bits of a subarray block 110 are accessed (read from or written to) when one word line 112 is selected and driven high. Data from accessed cells are provided simultaneously to the bit lines 108 and redundant bit lines 102 and 104. After a predetermined minimum delay, a delay sufficient to allow the redundancy decoder to determine whether a spare column is addressed, a single bit line 108 or a redundant bit line 102, 104 is selected in each subarray 106. In each subarray, the selected bit line 108 or redundant bit line 102, 104 is coupled to a Local Data Line (LDL) 114. LDLs 114 are coupled to Master Data Lines (MDLs) 116. The MDLs 116 couple corresponding subarrays 106 in each subarray block 110. Data is transferred between the subarrays 106 and the chip I/O's on the MDLs 116.

FIG. 2 is a transistor level cross-sectional schematic of a bit line 108 in a subarray 106. Cells 120, 122 connected to adjacent word lines 112, 118 also are connected to opposite lines 124, 126 of each bit line pair. Thus, half of the word lines 112 (e.g., word lines with even addresses) select cells 120 on one line 124 of the bit line pair. While the remaining half of the word lines 118, (odd addressed word lines) select the cells 122 on the other lines 126 of the bit line pair. Each cell's storage capacitor ($C_S$) 128 is, typically, a trench capacitor or a stacked structure for array density. Each bit line 124, 126 has essentially the same capacitance ($C_{BL}$).

As is known in the art, the maximum voltage that an FET will pass is its gate voltage ($V_G$) reduced by the FET's turn-on or threshold voltage ($V_T$), i.e., the storage capacitors 128, 138 voltage $V_S = V_{GS} - V_T$. The magnitude of the bit line signal is $C_S * V_S/(C_S + C_{BL})$. During a write, if a bit line 124, 126 ($C_{BL}$) is charged to the supply voltage level $V_{dd}$ (also referred to as $V_h$) and if the word line 112, 118 is also at $V_{dd}$, then $V_S = V_{dd} - V_T$. Normally, the bit lines are pre-charged to some known voltage, e.g. $V_{dd}/2$, prior to reading a cell. Therefore, the bit line signal $V_{SIG} = C_S(V_S - V_{dd}/2)/(C_S + C_{BL})$. With $V_S = V_{dd} - V_T$ or 0, then either $V_{SIG} = C_S(V_{dd}/2 - V_T)/(C_S + C_{BL})$ or, $V_{SIG} = -C_S(V_{dd}/2)/(C_S + C_{BL})$. So, to maximize bit line signal $V_{SIG}$, the word line 112, 118 is boosted during a write, typically, to at least $V_{dd} + V_T$ so that $V_S = V_{dd}$ is written into the cell. This boosted level, called $V_{pp}$, is normally generated on-chip. With $V_{pp=Vdd} + V_T$, $V_{SIG} = \pm C_S(V_{dd}/2)/(C_S + C_{BL})$.

The circuit of FIG. 2A operates according to the timing diagram of FIG. 2B. A "one" is stored in any cell 120, 122 by charging the cell's storage capacitor 128, 138. Prior to selecting a cell 120 or 122, the array is at its steady-state standby or pre-charge condition. The voltage on the bit line pair 124, 126 is pulled to $V_{dd}/2$ and equalized by equalization transistor 134 because equalization signal EQ on its gate 132 is high. The Word Lines (WL) 112,118 and Column SeLect (CSL) lines 136 are held low during standby. In prior art RAMs, each word line was clamped low (unless driven high) by a simple resetable latch (not shown).

When the chip's Row Address Strobe signal (RAS) is asserted indicating the array is to be accessed. EQ is pulled low, isolating the bit line pair from each other and from the $V_{dd}/2$ pre-charge supply, floating the individual lines of the pair at $V_{dd}/2$. A selected word line 112 (or 118) is driven high. The cell's access gate 130 is turned on in each cell 120 on the selected word line 112, coupling the accessed cell's storage capacitor 128 to line 124 of the bit line pair. Thus, $V_{SIG}$ develops when charge is transferred between the storage capacitor 128 and line 124. The other line 126 of the bit line pair 124,126 remains at its pre-charge voltage level $V_{dd}/2$ and serves as a reference voltage for the sense amplifier 140.

Typically, bit line capacitance is at least one order of magnitude larger than the storage capacitor 128. So, $V_{SIG}$ is normally at least an order of magnitude smaller than $V_{dd}$. To maximize charge transfer between the bit line 124 and the storage capacitor 128, the word line 112 is boosted to $V_{pp} \geq V_{dd} + V_T$. Thus, one line of the pair (124 or 126) remains at $V_{dd}/2$, while the other (126 or 124) is driven to $V_{dd}/2 + V_{SIG} = (V_{dd}/2)(1+C_S)/(C_S + C_{BL})$.

After a delay sufficient to develop $V_{SIG}$, i.e. to transfer $V_S$ to the bit line, the sense amp 140 is set by driving the Sense Amp Enable (SAE) line 142 high and, subsequently, by pulling its inverse ($\overline{SAE}$) 144 low. $V_{SIG}$ is amplified and re-driven on the bit line pair 124, 126 by the sense amp, which forces 124,126 High/Low or Low/High depending on data stored in the cell 120. Simultaneously with re-driving the bit line pair, the sense amp writes the sensed data back into the selected cell 120. Once all of the bit lines 124, 126 have been re-driven, a Column SeLect signal (CSL) rises to activate the column decoder for column i. So, driving CSL 146 high selects column i in each accessed subarray 106 by connecting the selected column i bit line pair 124,126 to the LDLs 148, 150 through pass gates 152, 154.

One source of cell failures stems from inadequate (cell) signal margin. During initial manufacturing tests, at ideal operating conditions, all of the cells may appear good. However, in writing some cells, not all of the charge may be stored nor retained (known as a weak "1") or $C_S$ may not be fully discharged (known as a weak "0"). In other than ideal operating conditions, these cells may not consistently reflect the data written into them. Such a failing cell may appear acceptable under test conditions, but when used in system memory, the cell may fail, intermittently. So, it is important to identify such cells (with marginal stored data levels) during test.

FIG. 3 represents a bit line pair 124, 126 upon which cell signal margin may be tested by a prior art approach. In this prior art test, the bit line pre-charge voltage $V_{PRE}$ is varied. Normally, as described for FIG. 2A, $\Phi_{EQ}$ 132 is high during restore and low during sense. Pre-charge FETs 156,158 are connected between $V_{PRE}$ and bit lines 126,124 respectively. Under normal operating conditions, $V_{PRE}$ is set to $V_{dd}/2$. However, during test, $V_{PRE}$ is intentionally varied to reduce $V_{SIG}$ and change the sense amp reference voltage. Since $V_{PRE}$ is varied form $V_{dd}/2$, $V_{SIG}=C_S(V_S-V_{PRE})/(C_S+C_{BL})$ so, for example, if $V_{PRE}$ is reduced below $V_{dd}/2$, the difference between $V_{PRE}$ and 0V is reduced so that the 0 data signal is reduced.

However, raising or lowering $V_{PRE}$ affects the sense amp 140 operation in ways unrelated to signal margin. If, for example $V_{PRE}<V_{TN}$, then, when SAE is driven high to set the sense amps, neither of the sense amp cross coupled NFETs may turn on. Sensing is therefore through the significantly slower cross coupled PFETs. So, on prior art RAMs, to insure that the sense amps function correctly, $V_{PRE}$ cannot be reduced below $V_{TN}$. Furthermore, because $V_{SIG}$ is dependant upon $V_{PRE}$, varying $V_{PRE}$ significantly from $V_{dd}/2$ alters the time it takes for $V_{SIG}$ to develop. Altering this time makes it difficult to determine whether testing failures are due to poor signal margin and, therefore, real or, instead, the result of not allowing adequate time for signal development and, therefore, false errors.

Other prior art signal margin test schemes required additional chip space for reference cells or for special test circuitry. These other prior art signal margin test schemes also were not very reliable.

PURPOSES OF THE INVENTION

It is a purpose of the present invention to reduce semiconductor memory test time.

It is another purpose of the present invention to simplify semiconductor memory test.

It is another purpose of the present invention to reduce the time required to identify defective semiconductor memory chips.

It is another purpose of the present invention to simplify initial semiconductor memory chip test screening.

It is another purpose of the present invention to increase RAM signal test accuracy.

It is another purpose of the present invention to reduce RAM chip area dedicated for signal test.

It is another purpose of the invention to reduce test induced noise during RAM cell signal margin tests.

SUMMARY OF THE INVENTION

In the preferred embodiment of the present invention, a control circuit uses the equalization voltage to disable the sense amp. Thus, cell signal margin may be tested in a new way. Instead of varying the sense amp reference voltage, as in prior art signal margin tests, cell signal margin is tested by varying cell signal $V_S$. $V_S$ may be selected, to determine both a high and a low signal margin. A bit line pair is coupled through a pair of high-resistance pass gates to a sense amp. During sense, the high-resistance pass gates act in conjunction with the charge stored on the bit line pair as, effectively, a high-resistance passive load for the sense amp. A control circuit selectively switches on and off bit line equalization coincident with selectively passing either the equalization voltage or set voltages to the sense amp and an active sense amp load. Further, after it is set, the sense amp is selectively connected to LDLs through low-resistance column select pass gates. Therefore, the sense amp quickly discharges one of the connected LDL pair while the bit line voltage remains essentially unchanged. Thus, data is passed from the sense amp to a second sense amplifier and off chip. After data is passed to the LDLs, the control circuit enables the active sense amp load to pull the sense amp high side to a full up level.

The preferred embodiment Dynamic Random Access Memory (DRAM) includes an array of memory cells arranged in rows and columns, a word line in each row responsive to a row address and a pair of complementary bit lines in each of the columns. The DRAM further includes a sense amp in each of the columns connected between a sense enable and the complementary bit line pairs; a bit line pre-charge connected to each pair of complementary bit lines, the bit line pre-charge being connected between the complementary bit line pair and a reference voltage; and, a test control circuit for selectively holding the sense amp disabled and the bit line pairs in a pre-charge state responsive to a test control signal. The sense amp is latched by an active sense amp load connected between the sense amp and a load enable. The test control circuit also includes means for selectively holding active sense amp load disabled responsive to the test control signal.

When the test control signal is in a first state, the test control circuit disables the bit line pre-charge responsive to a first timing signal and enables the sense amp and the active sense load responsive to a second timing signal. The bit lines are held in the pre-charged state and the sense amp and the active sense amp load are held disabled when the test control signal is in a second state. The sense amp and the active sense amp load are disabled by holding sense amp enable and load enable at the reference voltage.

DESCRIPTION OF THE PREFERRED EMBODIMENTS

In the preferred embodiment of the present invention, a bit line pair is coupled through a pair of high-resistance pass gates to a sense amp. During sense, the high-resistance pass gates act in conjunction with the charge stored on the bit line pair as, effectively, a high-resistance passive load for the sense amp. A control circuit selectively switches on and off bit line equalization coincident with selectively passing either the equalization voltage or set voltages to enable the sense amp. Further, after it is set, the sense amp is selectively connected to LDLs, which are pre-charged to $V_{dd}$, through low-resistance column select pass gates. The column select pass gates, which are NFETs, allow passing data to the LDLs prior to setting the active sense amp load even though the LDLs are pre-charged to $V_{dd}$. The NFET threshold prevents the $V_{dd}$ pre-charge on the LDLs from destroying the sensed data. The sense amp quickly discharges one of the connected LDL pair while the bit line voltage remains essentially unchanged. Thus, data is passed from the sense amp to a second sense amplifier and off chip. After data is passed to the LDLs, the control circuit enables the active sense amp load to pull the sense amp high side to a full up level. Finally, the gate voltage on the high resistance pass gates is boosted to reduce their select resistance in order to quickly write the sensed data back into the array.

Figure 1:
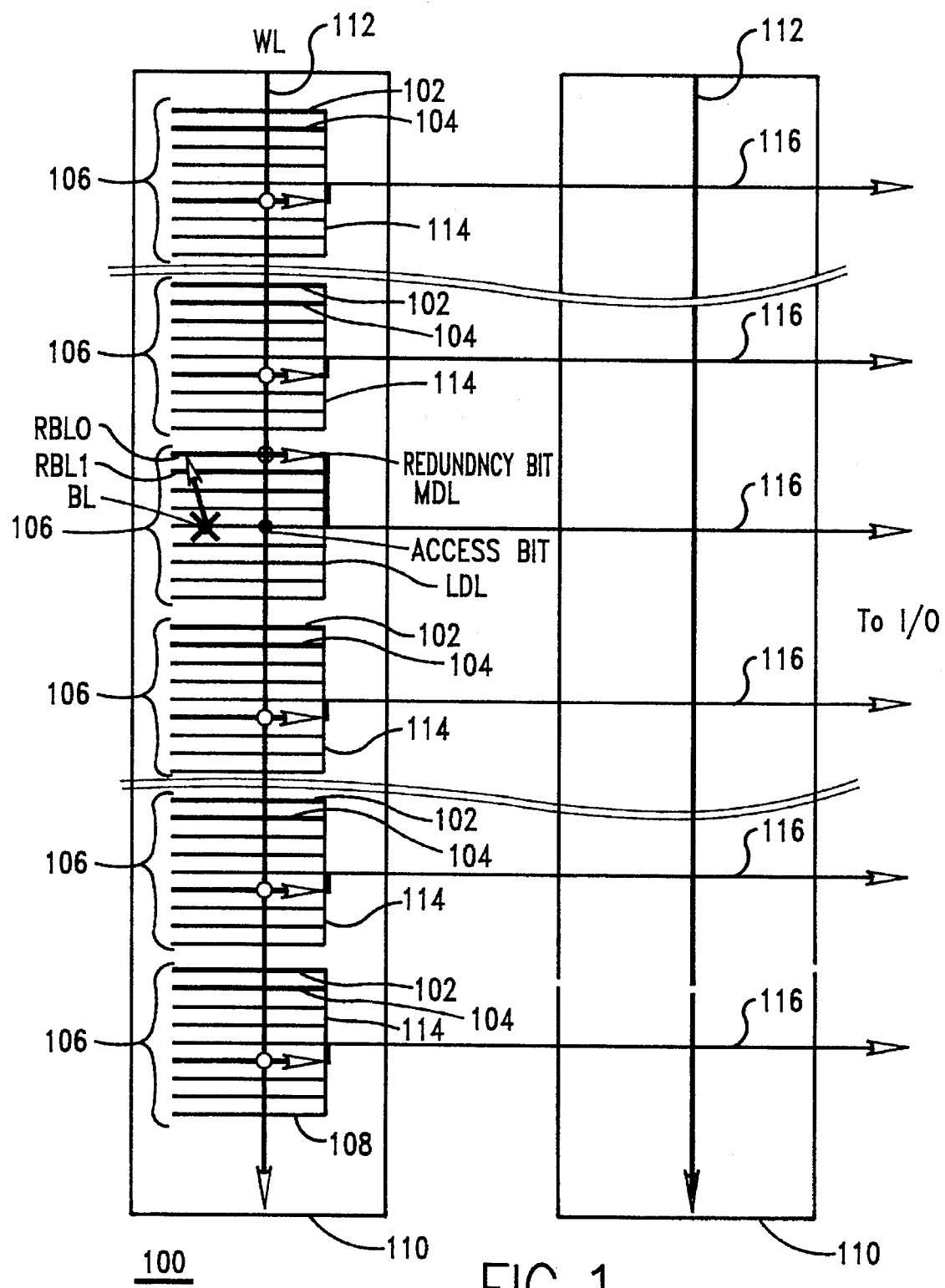
FIG. 1 is a schematic representation of a prior art wide I/O RAM.
Figure 2A:
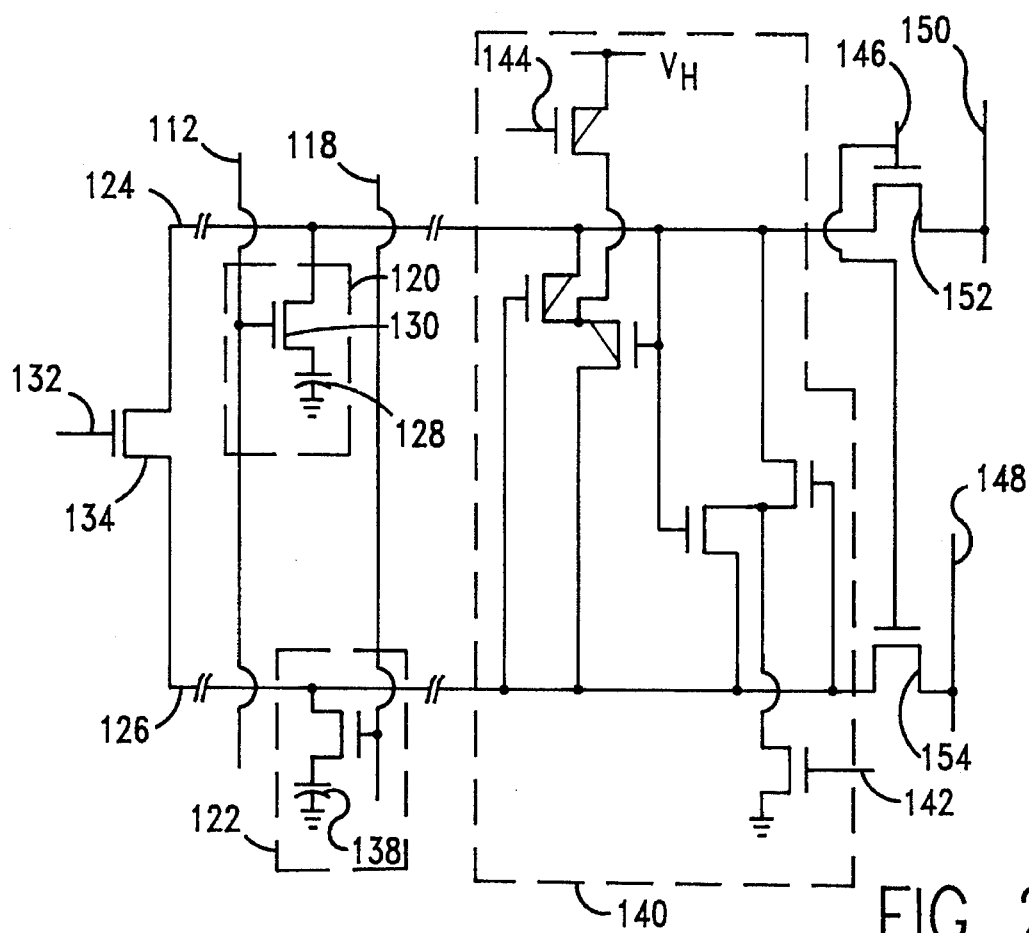
FIG. 2A is a transistor level cross-sectional schematic of a prior art segment.
Figure 2B:
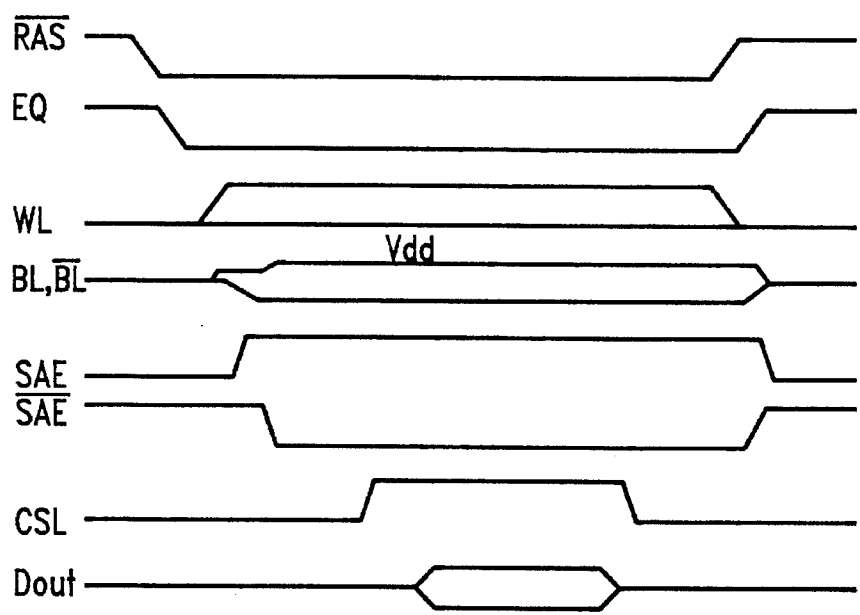
FIG. 2B is a timing diagram for the cross section of FIG. 2A.
Figure 3:
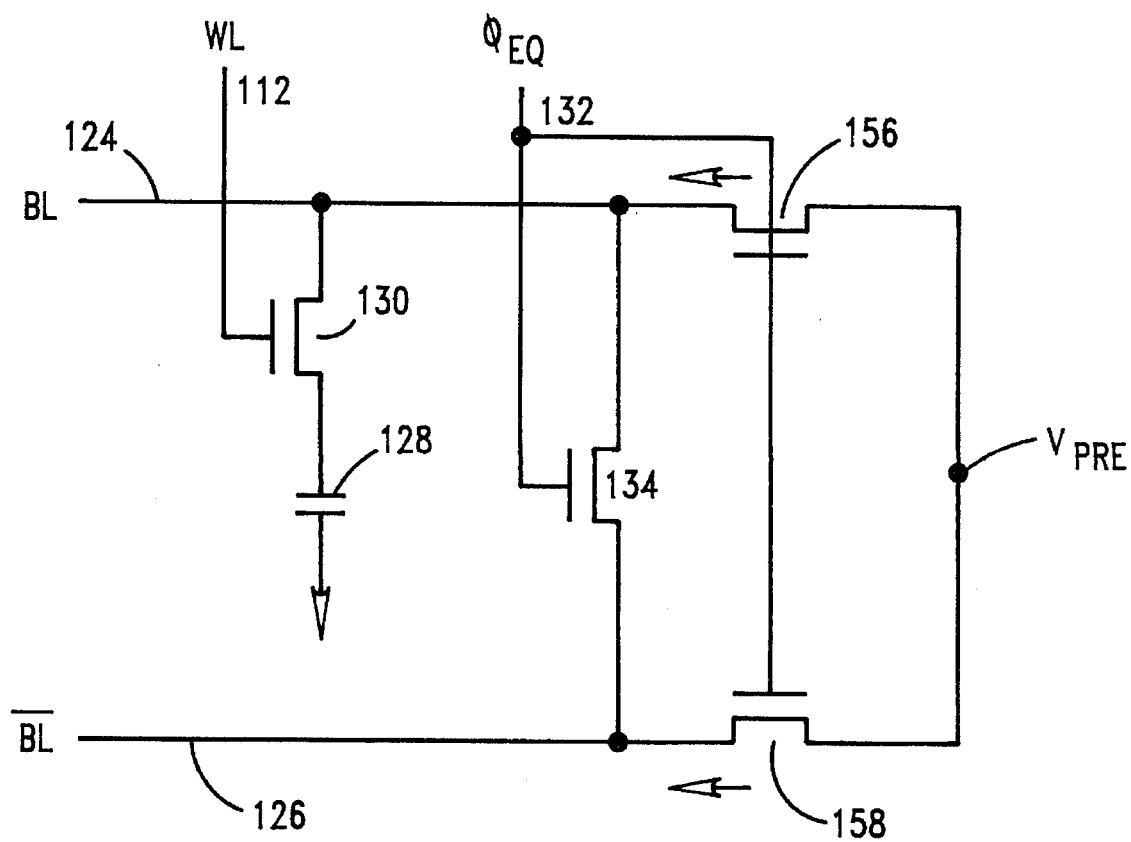
FIG. 3 represents a RAM bit line equalization testable according to the prior art method.
Figure 4A:
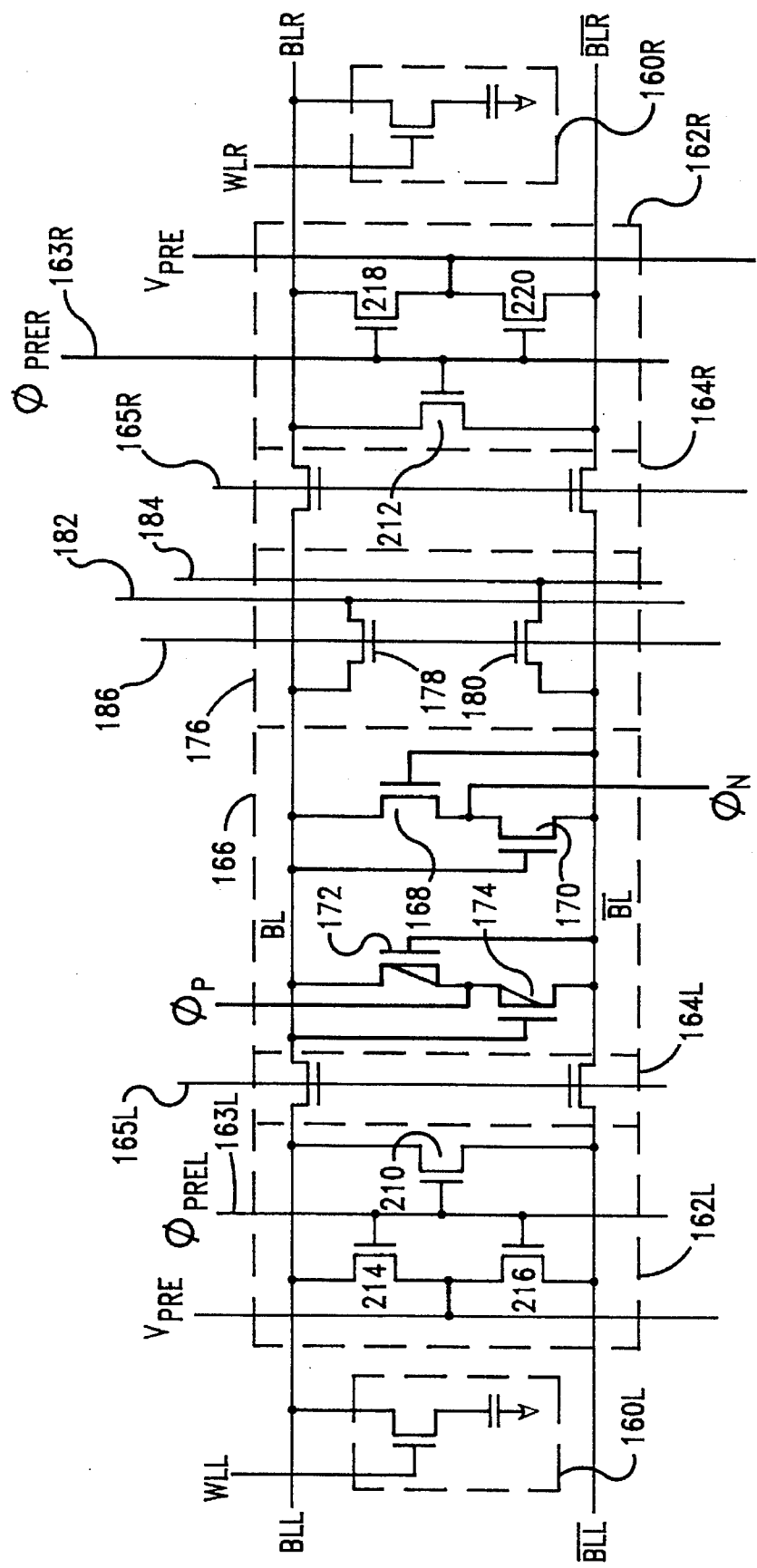
FIGS. 4A–C schematically represents an array cross section, a sense circuit and control logic according to the preferred embodiment of the present invention.
Figure 4B:
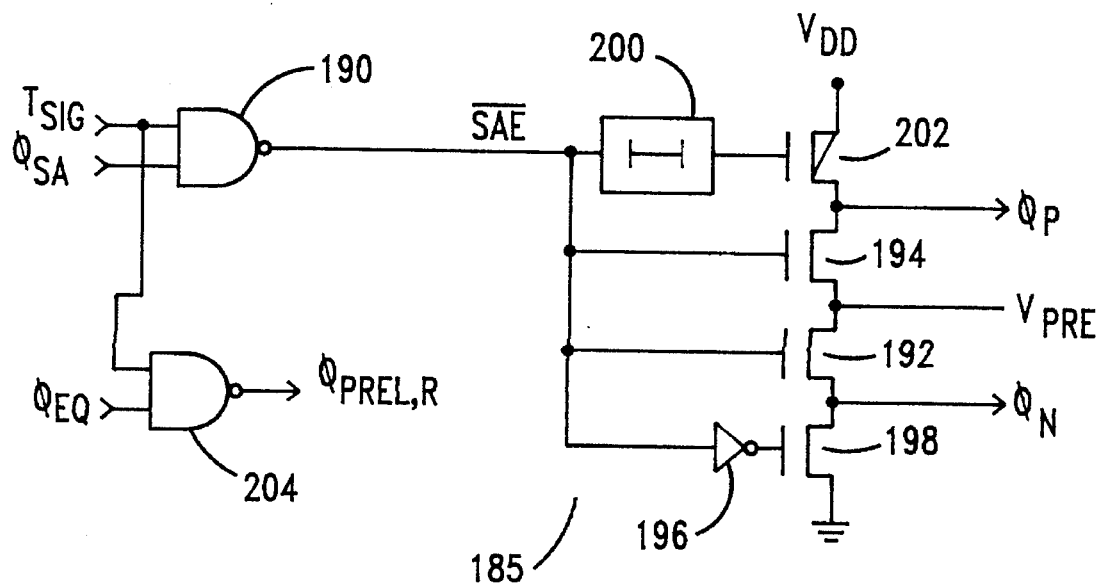
Figure 4C:
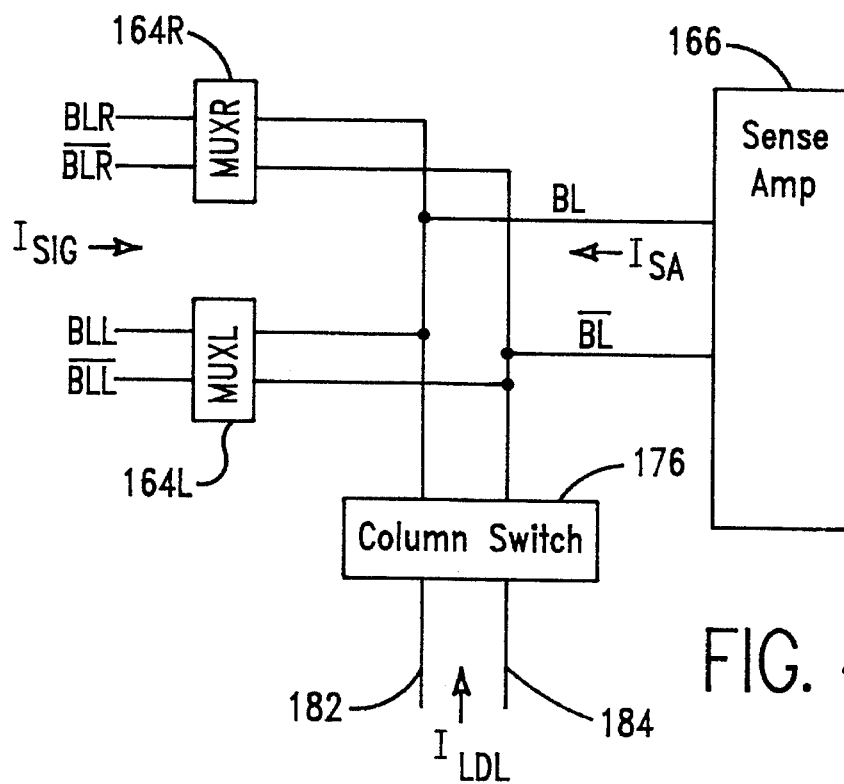

Additionally, because the equalization voltage is provided by the control circuit to disable the sense amp, cell signal margin may be tested in a new way. Instead of varying the sense amp reference voltage, as in prior art signal margin tests, cell signal margin is tested by varying the signal written to the cell. $V_S$ may be selected to determine both a high and a low signal margin. FIG. 4A schematically represents an array cross section with a sense amp shared by two bit line pairs and FIG. 4B is a schematic of control logic therefor according to the present invention. It is intended that each sense amp may be connected to a single bit line pair, or to two or more bit line pairs without departing from the spirit of the present invention. FIG. 4C is a block diagram of the sense amp, column switch and mux of FIG. 4A.

FIG. 4A shows the sense amp 166 shared by two bit line pairs, a right pair and a left pair. For convenience, these pairs, and elements in each pair, are labeled L and R. Thus, the cell in the left pair is designated 160L and the cell in the right pair is designated 160R. Each bit line pair includes an equalization circuit 162L, 162R, gated by a restore line 163L, 163R, which operates substantially as described above. Additionally, in this shared sense amp configuration, each bit line pair is coupled to the sense amp by a pair high-resistance pass gates 164L or 164R, which are half of a multiplexer (mux). Each pair is referred to herein as a mux half 164L, 164R. The mux 164 (164L combined with 164R) is controlled by select lines 165L, 165R, respectively, to selectively couple the selected bit line pair to the sense amp 166. The sense amp 166 is a pair of cross coupled NFETs 168, 170 and is enabled by $\Phi_N$ from the control circuit 185 in FIG. 4B. $\Phi_N$ is connected to the sources of NFETs 168, 170. The sense amp 166 output is connected to the mux 164 at sense amp output pair BL, $\overline{BL}$.

The sense amp is designed to minimize the capacitance on BL, $\overline{BL}$ so that, during a READ, the bit line pair sees a low RC in the mux direction, as indicated by the arrow labelled $I_{SIG}$ in FIG. 4C. By contrast, the sense amp 166 sees a high RC in the mux direction, as indicated by the arrow labelled $I_{SA}$ in FIG. 4C. Therefore, when the sense amp is coupled to a bit line pair through a mux half 164L, 164R, the signal on the bit line pair is passed to the sense amp, substantially unaffected. However, when the sense amp 166 is set, the mux pass gates act as load resistors for the sense amp and the voltages on the bit line pair remain essentially unaffected.

Data, from the sense amp is provided to column switch 176, which is a pair of low resistance NFET pass gates 178, 180. Column switch 176 connects the sense amp 166 output at BL, $\overline{BL}$ to Local Data Lines (LDLs) 182, 184, when $CSL_i$ 186 is high. These column switch pass gates 178, 180 have a substantially lower on resistance than the mux half 164L, 164R pass gates. Therefore, when the set sense amp 166 is connected to the LDLs through the column switch 176, the primary current through the sense amp 166 is $I_{LDL}$ from the LDLs, even though a mux half 164L, 164R remains selected and current continues to flow through the selected mux half. Because the column switch 176 is a pair of NFETs, the potential disturb from coupling the charged (to $V_{dd}$) LDL capacitances to the sense amp is essentially eliminated. The NFET pass gates, because of the NFET threshold voltage, effectively attenuate the noise that is normally introduced in such coupling. Thus, the potential disturb is eliminated. LDLs 182, 184 are connected through the MDLs to a traditional sense amp (not shown). This second sense amp exploits the advantages provided by the present invention to improve performance by amplifying the sense amp 166 output as soon as the sense amp 166 places sufficient signal on the LDLs 182, 184.

After the data is passed to the LDLs, an active sense amp load, a pair of cross coupled PFETs 172, 174, connected to the sense amp 166 output pair BL, $\overline{BL}$, latches the data sensed thereby and provides a full-$V_{dd}$ up level and reinforces and during a normal write. $\Phi_P$, the active sense amp load enable from control circuit 185, is connected to the sources of cross coupled PFETs 172, 174.

Unlike prior art DRAM sensing schemes such as disclosed in U.S. Pat. No. 5,267,214 to Fujishima et al., entitled "Shared-Sense Amp Control signal Generating Circuit in Dynamic Type Semiconductor Memory Device and Operating Method Therefor" which is incorporated herein by reference, these two cross coupled PFETs are not part of the sense amp. Fujishima teaches a RAM wherein the bit lines are connected to the sense amp by low resistance pass gates. Fujishima's pass gates low resistance is further reduced when, after enabling and setting the NFET half of the sense amp, the drive to the bit line pass gates is boosted above $V_{dd}$ coincident with enabling the PFET portion of the sense amp. At this point, the sense amp drives full voltage levels back into the bit line pair. Only after setting this PFET half of Fujishima's sense amp are the column select pass gates opened, thus delaying data from being driven off chip.

By contrast, with the present invention, data has already been passed off chip prior to setting this active load. Furthermore, access time has not been extended for discharging and charging the bit line pair to full voltage levels prior to transferring data off chip. Instead, the bit line pair are driven to full levels subsequent to passing data off chip to a waiting user and still after the PFET loads 172, 174 are set.

In the preferred embodiment of the present invention, after the first bit of a block is read, the mux select line is boosted above $V_{dd}$ to gate full levels to the bit line pair from the sense amp 166 and active sense amp load. When the mux control is boosted above $V_{dd}$, substantially all sense amp current $I_{SA}$ is to/from the bit line pair.

The special control circuit 185 of FIG. 4B provides both normal control and test-specific control for the array, the sense amp and the active sense amp load. Control circuit 185 input, Test control signal $T_{SIG}$, remains high and is driven low during test only. $T_{SIG}$ is NANDed with $\Phi_{SA}$ in NAND gate 190 to generate Sense Amp Enable $\overline{SAE}$. $\overline{SAE}$ is connected directly to the gates of NFETs 192, 194, which are connected between $V_{PRE}$ and $\Phi_P$ or $\Phi_N$, respectively. So, the state of $\overline{SAE}$ selects the level of both sense amp enable/disable phase $\Phi_N$ and active sense amp load enable/disable phase $\Phi_P$. $\overline{SAE}$ is the input to inverter 196. The output of inverter 196, SAE, is connected to the gate of NFET 198 which is connected between $\Phi_N$ and ground. Also, $\overline{SAE}$ is the input of delay 200, the output of which is connected to the gate of PFET 202. PFET 202 is connected between $V_{dd}$ and $\Phi_P$ to provide a corresponding path to $V_{dd}$ for cross coupled PFETs 172, 174.

$T_{SIG}$ is also NANDed in one or more NAND gates, represented by single NAND gate 204, with $\Phi_{EQ}$ to generate $\Phi_{PREL}$ and $\Phi_{PREL}$ ($\Phi_{PREL,R}$). Preferably, $\Phi_{EQ}$ is two independent signals $\Phi_{EQL}$ and $\Phi_{EQR}$, which are each NANDed with $T_{SIG}$. Alternatively, an additional L/R select signal may be NANDed with $\Phi_{EQ}$ and $T_{SIG}$ to generate $\Phi_{PREL,R}$. Optionally, $\Phi_{PREL}$ and $\Phi_{PRER}$ may be, simply, identical signals generated from NANDing $\Phi_{EQ}$ and $T_{SIG}$.

At steady state, during standby, $\overline{RAS}$ is high and, $T_{SIG}$ is normally high. Both $\Phi_{EQ}$ and $\Phi_{SA}$ are low, holding $\Phi_{PREL,R}$ and $\overline{SAE}$ high, so that the bit lines and both $\Phi_N$ and $\Phi_P$ are at $V_{PRE}$ (to disable the sense amp 166). However, during an access, after SAE is high, ($\overline{RAS}$ and $\overline{SAE}$ are low), $\Phi_P$ is high (at $V_{dd}$) and $\Phi_N$ is low (at ground). Thus, NFET 198 selectively provides a path to ground for the sense amplifier 160, when it is turned on and PFET 202 selectively provides a path to $V_{dd}$ for the sense amplifier active load, when it is turned on.

$\overline{SAE}$ is delayed by delay 200 until after the sense amp is set and passed through the column switch 176 to LDLs 182, 184. In the preferred embodiment of the present invention, delay 200 is a simple polysilicon RC delay with inverters for reforming the signal therefrom. In another alternate embodiment, delay 200 is an even number of series connected inverters and, more particularly, between 6 and 8 inverters.

Figure 5:
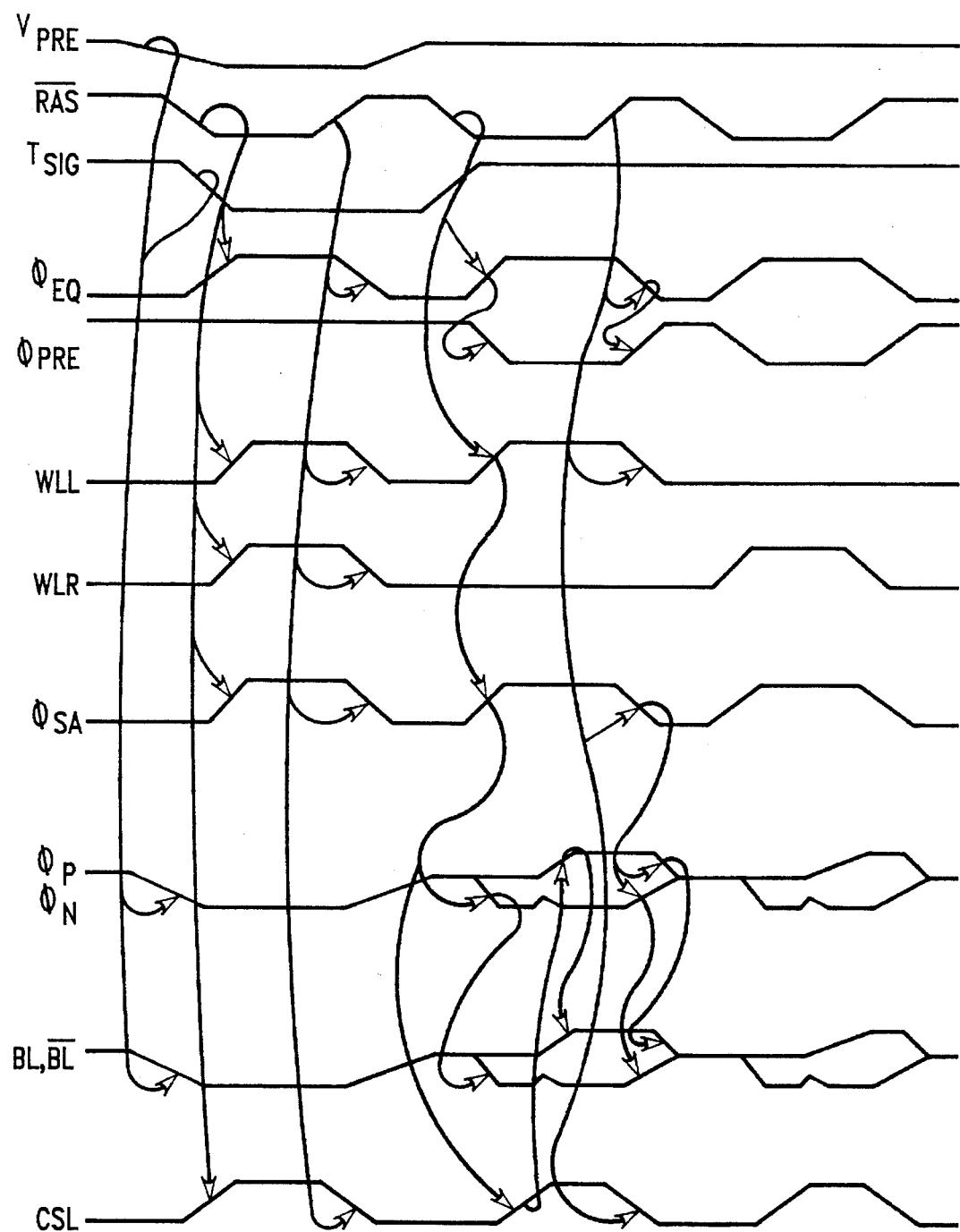
FIG. 5 is a timing diagram for the RAM of FIGS. 4A–C for determining cell signal margin according to the preferred embodiment of the present invention.
Figure 6:
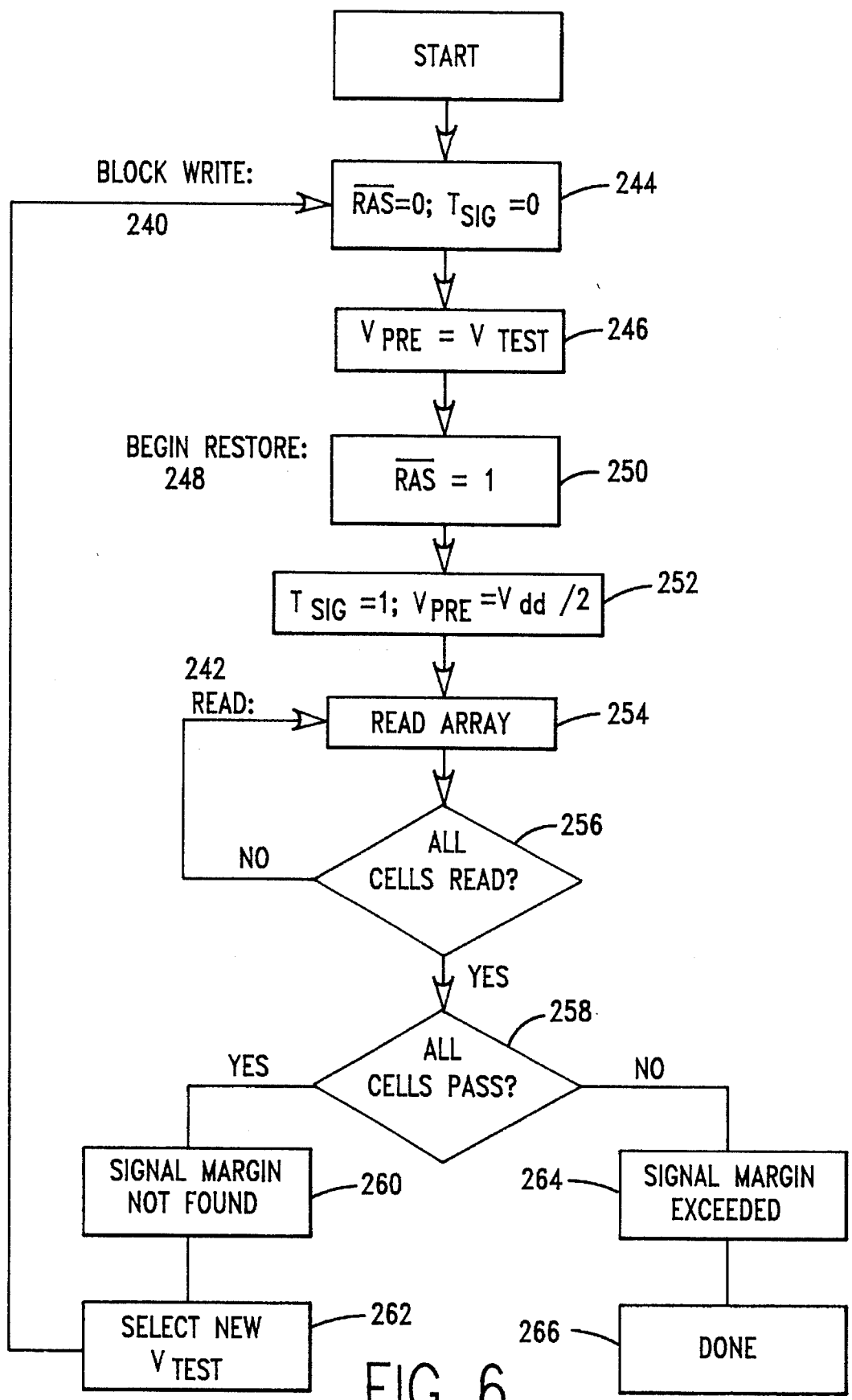
FIG. 6 is a flow diagram for testing DRAM cell signal margin according to the preferred embodiment of the present invention.

FIG. 5 is a timing diagram for performing a signal margin test on the array of FIG. 4A using the logic of FIG. 4B according to the preferred embodiment of the present invention. FIG. 6 is a flow diagram for testing a DRAM according to the preferred embodiment of the present invention. Normally, $T_{SIG}$ is tied high and $V_{PRE}$ is held at $V_{dd}/2$. $\overline{RAS}$, which provides a typical DRAM select function, drives a typical timing chain that selects and drives the word line WL, bit line equalization signal $\Phi_{EQ}$ and sense amp enable signal $\Phi_{SA}$. Under normal operating conditions, $V_{PRE}$ is held at $V_{dd}/2$ and is varied therefrom only during test. During test, $V_{PRE}$ is from a controllable, variable voltage power supply that provides a tester controlled supply voltage. NFETs 192, 194 couple $V_{PRE}$ to $\Phi_N$ and $\Phi_P$, normally, during standby, when $\overline{RAS}$ is high, but also during test, when both $T_{SIG}$ and $\overline{RAS}$ are low. $\Phi_{PREL}$, $\Phi_{PRER}$ are low only when equalization signal $\Phi_{EQ}$ and Test control signal $T_{SIG}$ are both high. So, the pair of lines in each bit line pair are tied together and to $V_{PRE}$ when $\overline{RAS}$ is high, but also during test, when both $T_{SIG}$ and $\overline{RAS}$ are low. $V_{PRE}$ is uncoupled from the bit lines and sense amp during sense. Preferably, $\Phi_P$, $\Phi_N$, and $\Phi_{PREL,R}$ are common lines provided to multiple bit lines. Alternatively, the control of $\Phi_P$, $\Phi_N$, and $\Phi_{PREL,R}$ may be generated individually for each bit line pair.

Thus, according to the present invention, measuring cell signal margin is, basically, a two step test. First, in a "Block Write" step 240, a reduced signal is written to all of the cells 160L, 160R. During this first step 240, the bit line voltage level is forced to a test voltage level, $V_{TEST}$. $V_{TEST}$ is a level offset from $V_{dd}$ or ground by some fraction of $V_{dd}$. Loading the test voltage, effectively writes a weak "1" or "0" into the array. Then, in the second basic step 242, the array is read, normally, to determine if the reduced signal can be sensed (read) correctly. Thus, by executing these two basic steps and some ancillary steps, as described herein, a DRAMs signal margin may be determined.

So, first, the Block Write step 240 begins when $\overline{RAS}$ and $T_{SIG}$ are driven low 244. Next, $V_{PRE}$ is ramped up or down (down in this example) to $V_{TEST}$ 246. Because $T_{SIG}$ is low, all of the word lines WLL and WLR are driven high simultaneously to write the weak signal ($V_{PRE}$) into the entire array. Optionally, only a portion of the array may be tested by selecting and driving an individual word line or a subset of word lines. Timing Equalization control phase $\Phi_{EQ}$ is driven high with the word lines WLL and WLR as during a normal access cycle. However, because $T_{SIG}$ is low, $\Phi_{EQ}$ is blocked so that $\Phi_{PREL,R}$ remains high. Once the word lines are high, timing Sense Amp control phase $\Phi_{SA}$ also rises but, is also blocked, because $T_{SIG}$ is low. So, $\Phi_P$ and $\Phi_N$ remain at $V_{PRE}$ and the sense amp 166 remains disabled. After storing the test voltage level ($V_{PRE}$) as $V_S$ in all of the cells, $\overline{RAS}$ rises ending the write operation, placing the RAM in standby (pre-charge). Throughout the Block Write, the sense amp remains disabled and the bit lines remain clamped at $V_{PRE}$ because $\Phi_N$ and $\Phi_P$ are clamped at $V_{PRE}$ and precharge (equalization) signals $\Phi_{PREL,R}$ remain high.

Once the block write is complete, the RAM is restored 248, placing it in standby and returning it to its normal operating condition. $\overline{RAS}$ rising 250 drives all of the word lines and $\Phi_{SA}$ low. Next in step 252, $V_{PRE}$ is ramped back to $V_{dd}/2$, pulling all of the bit line pairs and both $\Phi_N$ and $\Phi_P$ back to $V_{dd}/2$. $T_{SIG}$ is held low until $V_{PRE}$ is returned to $V_{dd}/2$. Once $T_{SIG}$ rises 252, the Block Write step 240 is complete and the RAM is in its normal operating condition.

After the Block Write step 240, the RAM array is READ 254, 256 to determine whether any cell's signal limit has been exceeded 258. A correct result during the READ indicates that the signal limit has not been exceeded 260 and that some signal margin remains. Therefore, if, in spite of the reduced signal level $V_S$, every cell reads correctly 258 (as a low in this example) then, the entire test is repeated with slightly less signal 262 (a slightly higher $V_{PRE}$ level in this example). This test may be repeated until at least some cells fail, indicating that the signal limit has been exceeded 264 ending the test 266. In the example of FIG. 5, the reduced $V_S$ gives an incorrect result when the read step indicates that a high is stored in at least one cell.

So, in FIG. 5, during the Read step 242 $T_{SIG}$ is held high and $V_{PRE}$ is maintained at $V_{dd}/2$. The Read step 242 begins with second period where $\overline{RAS}$ is low. When $\Phi_{EQL,R}$ rise, because $T_{SIG}$ remains high, $\Phi_{PRE}$ falls shutting off equalization devices 210, 212 and isolating the bit line pairs from $V_{PRE}$ by shutting off NFETs 214, 216, 218, and 220. A word line WLL rises, connecting a cell 160L (with its reduced $V_S$) to the bit line pair BLL, $\overline{BLL}$ (to BLL in this first READ access). After the reduced signal $V_S$ is transferred to the bit line pair BLL, $\overline{BLL}$, $\Phi_{SA}$ rises again, this time driving $\overline{SAE}$ low. $\overline{SAE}$ low turns off NFETs 192, 194, isolating $\Phi_P$ and $\Phi_N$ from $V_{PRE}$. Coincidentally, $\overline{SAE}$ is inverted in inverter 196 driving SAE high. SAE high turns on NFET 198 to pull $\Phi_N$ to ground, which sets the sense amp 166. Depending on $V_{SIG}$, the sense amp pulls one of the sense amp outputs BL, $\overline{BL}$ low.

When the sense amp 166 is set, the selected half mux 164L acts as very high resistance load resistors for the sense amp 166. So, even though one side of the sense amp is pulled to ground, the selected half mux 164L limits the current that the sense amp pulls from the bit line pair and, the bit lines remain essentially at their sense condition, $V_{dd}/2$ and $V_{SIG}$. It is understood that after sufficient time in this state, the sense amp would discharge one of the bit line pair to ground through the mux 164.

After the sense amp is set, $CSL_i$ is driven high opening the column switch 176 connecting the local data lines 182, 184 to sense amp outputs BL, $\overline{BL}$, respectively. By contrast to the selected half mux 164L, the column switch pass gates 178, 180 have a much higher width to length ratio (W/L) and, therefore, exhibit much lower resistance. The column switch pass gates 178, 180 are designed such that, when the column switch 176 is selected, most of the current flowing into the sense amp is from the LDLs with the selected half mux 164L providing very little current from the bit line pair. Further, the NFET pass gates 178 and 180 limit the voltage passed from the LDLs to the sense amp 166, avoiding destruction of the sensed data therein.

Thus, almost simultaneously, data is sensed, passed to the LDLs 182, 184 and, then, passed to the MDLs for re-sensing in a second sense amp (not shown). This all occurs prior to setting the cross coupled PFETs 172, 174. This significantly reduces latency over prior art DRAMs, an important advantage.

Subsequently, $\overline{SAE}$ passes through the delay 200, pulling the gate of PFET 202 low, which drives $\Phi_P$ to $V_{dd}$. With $\Phi_P$ at $V_{dd}$, the cross-coupled PFET 172, 174 active sense amp load pulls the floating side of the sense amp high, to $V_{dd}$. Finally, the select is boosted for selected mux half 165L or 165R to reduce the mux's select resistance such that data is quickly forced onto bit line pair BL, $\overline{BL}$ and so, a full level is written back into the cell.

After each read during the test, $\overline{RAS}$ rises to end the READ and force the RAM into standby. Thus, $\overline{RAS}$ rising resets the word line WLL, pulling it low. After the word line falls, $\Phi_{SA}$ is pulled low. Again, $\Phi_{SA}$ is inverted by NAND gate 190 driving $\overline{SAE}$ high to pull $\Phi_P$ and $\Phi_N$ to $V_{PRE}$ through NFETs 192, 194. Once the sense amp is disabled, the equalization signal $\Phi_{EQ}$ is pulled low and NAND gate 204 inverts $\Phi_{EQ}$ to drive $\Phi_{PREL,R}$ high. Thus, with $\Phi_{PREL,R}$ high, equalization NFETs 210, 212 are on to effectively short the bit line pair together, while (at $V_{dd}/2$) passes through NFETs 214, 216, 218, and 220 to the bit line pairs.

This typical READ access is repeated as represented by the subsequent fall of RAS in FIG. 5, until all cells of interest are read and, therefore, tested. If, during any READ, an accessed cell provides insufficient bit line signal, the sense amp will sense it incorrectly (fail). Thus, if the array is filled with weak ones, an incorrect result is reading one or more zeroes and vice versa. As noted above, once all of the cells have been read, if no cells fail, then the signal margin exceeds the test voltage (applied during the block write on $V_{PRE}$). By repeating this test with slightly less signal (i.e., a slightly higher $V_{PRE}$ in this example) on each repetition until cells fail, the signal margin can be determined. Further, having tested the array cells for signal margin on one logic level, (a low to test the "zero" signal margin in this example) this test may also be repeated for the other logic level (e.g. high). The signal margin for the other logic level may be determined by ramping $V_{PRE}$ as appropriate (e.g., above $V_{dd}/2$) during the block array write operation and, then, reading the array normally as described above.

Thus, a DRAM may be tested for signal margin according to the present invention, much more reliably and accurately than prior art DRAMs. Furthermore, testing a DRAM according to the present invention does not require (and therefore, does not incur the overhead from) including a reference cell, nor from capacitive coupling devices. Also, sense timing problems encountered by prior art DRAMs are avoided. An additional feature of a DRAM including the signal margin test capability of the present invention, the entire array may be initialized to all ones or to all zeroes during system initialization by forcing $V_{PRE}$ to $V_{dd}$ or ground, respectively.

While the present invention is described in terms of preferred embodiments, it is understood that numerous variations and modifications will occur to a person skilled in the art without departing in spirit from the claimed invention. It is intended that the scope of the claims include those modifications and variations that fall within the spirit of the invention.

We claim:

1. A Dynamic Random Access Memory (DRAM) including an array of memory cells arranged in rows and columns, a word line in each said row responsive to a row address, a pair of complementary bit lines in each said column, said DRAM further comprising:

a sense amp in each said column connected between a sense enable and said pair of complementary bit lines;

a bit line pre-charge connected to each pair of complementary bit lines, said bit line pre-charge being connected between said complementary bit line pair and a reference voltage; and, test control means for selectively holding said sense amp disabled and said bit line pairs in a pre-charge state responsive to a test control signal.

2. The DRAM of claim 1 wherein the sense amp is latched by an active sense amp load connected between the sense amp and a load enable.

3. The DRAM of claim 2 wherein the test control means includes means for selectively holding said active sense amp load disabled responsive to said test control signal.

4. The DRAM of claim 2 wherein when said test control signal is in a first state, the test control means disables said bit line pre-charge responsive to a first timing signal and enables said sense amp and said active sense load responsive to a second timing signal, said bit lines being held in said pre-charged state and said sense amp and said active sense amp load being held disabled when said test control signal is in a second state.

5. The DRAM of claim 4 wherein the load enable is delayed from said sense amp enable.

6. The DRAM of claim 5 wherein the sense amp is a pair of cross coupled NFETs, the sources of the NFETs connected to said sense amp enable.

7. The DRAM of claim 6 wherein the active sense amp load is a pair of cross coupled PFETs, the sources of the PFETs connected to said load enable.

8. The DRAM of claim 4 wherein the sense amp and the active sense amp load are disabled by holding sense amp enable and load enable at said reference voltage.

9. A Dynamic Random Access Memory (DRAM) including an array of memory cells arranged in rows and columns, a word line in each said row responsive to a row address, a pair of complementary bit lines in each said column, said DRAM further comprising:

a sense amp in each said column connected between a sense enable and said pair of complementary bit lines, said sense amp being a pair of cross coupled NFETs, the sources of the NFETs connected to said sense amp enable;

an active sense amp load connected between the sense amp and a load enable, said active sense amp load being a pair of cross coupled PFETs, the sources of the PFETs connected to said load enable;

a bit line pre-charge connected to each pair of complementary bit lines, said bit line pre-charge being connected between said complementary bit line pair and a reference voltage; and, test control means for selectively holding said sense amp and said active sense amp load disabled and said bit line pairs in a pre-charge state responsive to a test control signal.

10. The DRAM of claim 9 wherein when said test control signal is in a first state, the test control means disables said bit line pre-charge responsive to a first timing signal and enables said sense amp and said active sense load responsive to a second timing signal, said bit lines being held in said pre-charged state and said sense amp and said active sense amp load being held disabled when said test control signal is in a second state.

11. The DRAM of claim 10 wherein the load enable is delayed from said sense amp enable.

12. The DRAM of claim 9 wherein the sense amp and the active sense amp load are disabled by holding sense amp enable and load enable at said reference voltage.

13. The DRAM of claim 9 wherein each said column includes a plurality of bit line pairs, each pair of said plurality of bit line pairs connected to a mux input, said sense amp being connected between an output of said mux and said sense amp enable.

14. A Dynamic Random Access Memory (DRAM) including an array of memory cells arranged in rows and columns, a word line in each said row responsive to a row address, a plurality of pairs of complementary bit lines in each said column, said DRAM further comprising:

a mux in each said column, each of said plurality of bit line pairs connected to an input to said mux;

a sense amp in each said column connected between a sense enable and an output of said mux, said sense amp being a pair of cross coupled NFETs, the sources of the NFETs connected to said sense amp enable;

an active sense amp load connected between the sense amp and a load enable, said active sense amp load being a pair of cross coupled PFETs, the sources of the PFETs connected to said load enable;

a bit line pre-charge connected to each pair of complementary bit lines, said bit line pre-charge being connected between said complementary bit line pair and a reference voltage; and, test control means for disabling said bit line pre-charge responsive to a first timing signal and enabling said sense amp and said active sense load responsive to a second timing signal when said test control signal is in a first state, said bit lines being held in said pre-charged state and said sense amp and said active sense amp load being held disabled when said test control signal is in a second state.

15. The DRAM of claim 14 wherein the load enable is delayed from said sense amp enable.

16. The DRAM of claim 14 wherein the sense amp and the active sense amp load are disabled by holding sense amp enable and load enable at said reference voltage.

* * * * *